United States Patent [19]

D'Souza et al.

[11] Patent Number: 5,396,170

[45] Date of Patent: Mar. 7, 1995

[54] SINGLE CHIP IC TESTER ARCHITECTURE

[76] Inventors: Daniel D'Souza; Ruth Alexander, both of 17999 Saratoga-Los Gatos Rd., Monte Sereno, Calif. 95030

[21] Appl. No.: 34,156

[22] Filed: Jun. 1, 1993

Related U.S. Application Data

[60] Division of Ser. No. 894,819, Jun. 8, 1992, Pat. No. 5,254,942, which is a continuation-in-part of Ser. No. 694,992, Apr. 25, 1991, abandoned.

[51] Int. Cl.[6] .................................... G01R 31/28
[52] U.S. Cl. .................... 324/158.1; 324/73.1; 371/22.3
[58] Field of Search .............. 324/158 R, 73.1, 158 T; 371/15.1, 22.1, 22.3, 25.1

[56] References Cited

U.S. PATENT DOCUMENTS

| | | | |
|---|---|---|---|
| 4,931,722 | 6/1990 | Stoica | 371/22.5 |
| 5,001,713 | 3/1991 | Whetsel | 371/22.3 |
| 5,056,093 | 10/1991 | Whetsel | 371/22.1 |
| 5,057,774 | 10/1991 | Verhelst et al. | 324/158 R |
| 5,103,450 | 4/1992 | Whetsel | 371/22.3 |
| 5,132,635 | 7/1992 | Kennedy | 324/158 R |
| 5,155,732 | 10/1992 | Jarwala et al. | 324/73.1 |

Primary Examiner—Ernest F. Karlsen
Attorney, Agent, or Firm—Jacques M. Dulin; Thomas C. Feix

[57] ABSTRACT

An integrated circuit (IC) test architecture and technique which can be used in conformity with the IEEE 1149.1 test standard and configured on a single chip. This chip can be remotely controlled via a PC or workstation to generate stimulus and collect response data to fully test an IC which matches the foot print of the test chip. The specified technique uses the IEEE test standard with additional logic on a single chip which permits at speed test functional test of ICs. The test chip can be connected to a PC or workstation via the four (4) channel Test Access Port. By remotely controlling the test chip from the PC or Workstation, stimulus and response data can be generated to completely test any Integrated circuit having a foot print matching the IC of the test chip. In one embodiment, the test chip is mounted on a probe card for at speed functional test of wafers. In another embodiment, the test chip is placed in a socket or adapter for at speed package level test. In another embodiment, the test chip is sandwiched between a device under test (DUT) and the PCB on which the DUT is mounted for at speed board test.

4 Claims, 13 Drawing Sheets

SINGLE CHIP IC TESTER ARCHITECTURE

CROSS REFERENCE TO RELATED APPLICATIONS

This is a divisional of application Ser. No. 07/894,819, filed on Jun. 8, 1992, now U.S. Pat. No. 5,254,942, which is a continuation-in-part of Ser. No. 07/964,992, filed on Apr. 25, 1991, now abandoned.

BACKGROUND OF THE INVENTION

1. Field of the Invention

The present invention relates generally to integrated circuit tester apparatus. More particularly, the present invention relates to test circuitry which may be configured on a single test chip or active probe card for performing tests on integrated circuits at speed.

2. Brief Description of the Prior Art

As integrated circuits (ICs) become more and more complicated, testing also becomes more complex. Generally, ICs may be tested at the die level, the package level and the board level. However, most attention is given to testing at the board level since testing of the assembled product (i.e., a printed circuit board constructed from a collection of digital integrated circuits) is most critical. The test problem at the board level addresses three concerns: (1) confirmation that each component performs its required function; (2) confirmation that the components are interconnected in the correct manner; and (3) confirmation that the components in the assembled product interact correctly and that the product performs its intended function.

To facilitate testing the Institute of Electrical Electronic Engineers (IEEE) promulgated the IEEE Standard Test Access Port and Boundary Scan Architecture, as described in the document IEEE Standard 1149.1. The standard was developed by the Joint Test Action Group (JTAG) and has become known in the integrated circuit industry as the JTAG standard. The standard was aimed at easing board tests.

The IEEE Standard 1149.1 enables integrated circuits to be tested using boundary-scan methodology after the integrated circuits have been permanently installed on a circuit board. The specified JTAG standard circuitry may be incorporated into a probe card to create an active probe card for die level tests. Further, the specified JTAG standard circuitry may be incorporated into an adapter socket to perform tests at the package level for integrated circuits which lack internal test circuitry and which are assembled on a printed circuit board designed for integrated circuits having built-in IEEE 1149.1 standard test circuitry.

A disadvantage with the JTAG standard circuitry is that it is limited to low speed tests since the speed of data along the test bus runs at about 20 MHz. Integrated circuits which operate at speeds of 100 MHz and above are becoming more common and it is desirable to test these devices at their operating speeds rather than at a low speed for several reasons.

First, it is difficult to test for all the critical pathways of a high performance at low speed. This is especially true for a device under test which has a high number of inputs and outputs, since testing at low speed first requires that all possible pathway combinations between the input and outputs of the device be identified and measured, from this information the critical pathways (i.e., a pathway between an input and an output by which a signal must travel before some other event occurs) must then be determined. Also, since propagation delays do not vary as a function of speed, a test will fail for a device which is tested at a slower speed for which it is rated. In contrast, since testing a device at speed confirms the function of the device, all the critical paths between the inputs and outputs of a device are automatically measured.

Further, for low speed tests of a high performance device, the test will likely fail to verify all the critical pathways, since one or more of the pathways may be interrupted by an internal register which would hold the signal in the pathway for an indefinite amount of time. At present, the preferred way to measure a critical pathway which is interrupted by an internal register is by using an electron beam prober. However, this technique requires knowledge of the location of the register layout within the device under test and electron beam probers are very expensive.

Further still, low speed tests will not detect the simultaneous switching output which indicates a defective device. Simultaneous switching noise is not likely to be generated at low speeds since the stray capacitance and inductance are more pronounced at high speeds. Simultaneous switching noise indicative of a bad device becomes very noticeable during an at speed test.

While the benefits of testing integrated circuits at speed as opposed to testing at a low speed test are well understood, current state of the art high speed testers such as the Hewlett Packard model 83000 and the Avantest models T3681 and T3683 are very expensive.

U.S. Pat. No. 5,056,093 issued to Whetsel discloses a system scan path architecture using the IEEE proposed standard test bus 1149.1. In Whetsel the architecture comprises a plurality of printed circuit boards each having a device select module (DSM) connected in daisy chain fashion with a series of primary and secondary scan paths. The DSMs include four ports for connection with the IEEE standard test bus. Whetsel teaches to reduce the overall test time by configuring the DSMs to select a desired scan path on a board or boards such that all nonessential secondary scan paths within each boundary scan region are not traversed. This arrangement permits independent control of testing selected scan paths without using the bypass mode of the IEEE 1149.1 test standard architecture. While a reduction in the overall test time may be achieved by the selective coupling of scan paths to the IEEE test bus, the actual test rate in Whetsel is limited to the speed of the IEEE test bus and the length of the longest path.

In addition to the boundary-scan techniques and related IEEE standard boundary-scan architecture for testing integrated circuits, it is known from the prior art to design integrated circuits with internal scan test capability.

For example, U.S. Pat. No. 4,931,722 issued to Stoica discloses a flexible imbedded test system for VLSI circuits wherein a logic chip is designed with a plurality of scan chains, wherein each scan chain contains a number of flip flops. The flip flop chains may be serially scanned or operate in parallel such that selected combinational logic units may be bypassed. Stoica teaches to operate the flip flop chains in a parallel manner for internal test purposes of the chip to reduce the total test time of the logic chip to the amount of time it takes to test the longest chain of flip flops in the logic chip.

The internal scan test approach of Stoica is complimentary rather than a substitution for the standardized boundary-scan approach for testing ICs. However, even if the two approaches were combined for a single comprehensive IC test procedure, there would still exist the low speed test limitations associated with the standard test bus. Accordingly, there is a definite need in the art for a boundary-scan test architecture which may be in accordance with the IEEE 1149.1 standard and which permits testing IC devices at speed such that functional testing of the ICs may be accomplished.

SUMMARY OF THE INVENTION

List of Objectives

It is therefore a primary objective of the present invention to provide an integrated circuit test architecture 7hich may be configured on a single chip and which achieves at speed test at all levels of integrated circuit design, including, but not limited to the wafer/die, package and board levels.

It is another object of the present invention to provide an integrated circuit test architecture of the type described which fully conforms to the IEEE 1149.1 test standard.

It is another objective of the invention to provide a single chip IC tester architecture which permits a reduction of signal path distance between the Device Under Test (DUT) pins and the stimulus and response data origins. By doing so inductive and capacitive loading of the cable connecting the DUT to its stimulus and response data is eliminated. The delays due to the length of the cables is also eliminated. By doing so, high speed tests at 300 Mhz and above can be achieved with a PC or workstation.

In summary, the present invention is an architecture that can be used with the IEEE 1149.1 Test Standard and configured on a single chip. This chip can be remotely controlled via a PC or workstation to generate stimulus and collect response data to fully test an IC that matches the foot print of the test chip.

The specified technique uses the standard with additional logic on a single chip. This chip can be connected to a PC or workstation via the four (4) channel Test Access Port. By remotely controlling this chip from the PC or Workstation, stimulus and response data can be generated to completely test any Integrated circuit matching the IC of the test chip.

The test chip can also be mounted on a probe card. For symmetry and ease of manufacture it can be split into four chips. At speed functional test of wafers can be done via a PC or workstation.

The test chip can also be put into a socket for package level test.

Finally, it can be sandwiched between the DUT and the PCB on which the device under test (DUT) is mounted for doing at speed board test.

List of Advantages of the Invention

An important advantages of the present invention is that, in view of providing all the required test circuitry on a single chip near the DUT, the distance between the pins of the integrated circuit or DUT and the origins of the stimulus and response data is greatly reduced, thereby substantially eliminating the inductive and capacitive loading problems associated with the prior art cable connections which are used for this purpose.

Another advantage of the present invention is that by remotely controlling the test circuitry, high speed tests on the order of 300 Mhz can be achieved using a personal computer or workstation.

These and other objects and advantages of the present invention will no doubt become apparent to those skilled in the art after having read the following detailed description of the preferred embodiment, contained in and illustrated by the various drawings.

IN THE DRAWING

DETAILED DESCRIPTION OF THE PREFERRED EMBODIMENT

Figure 1:
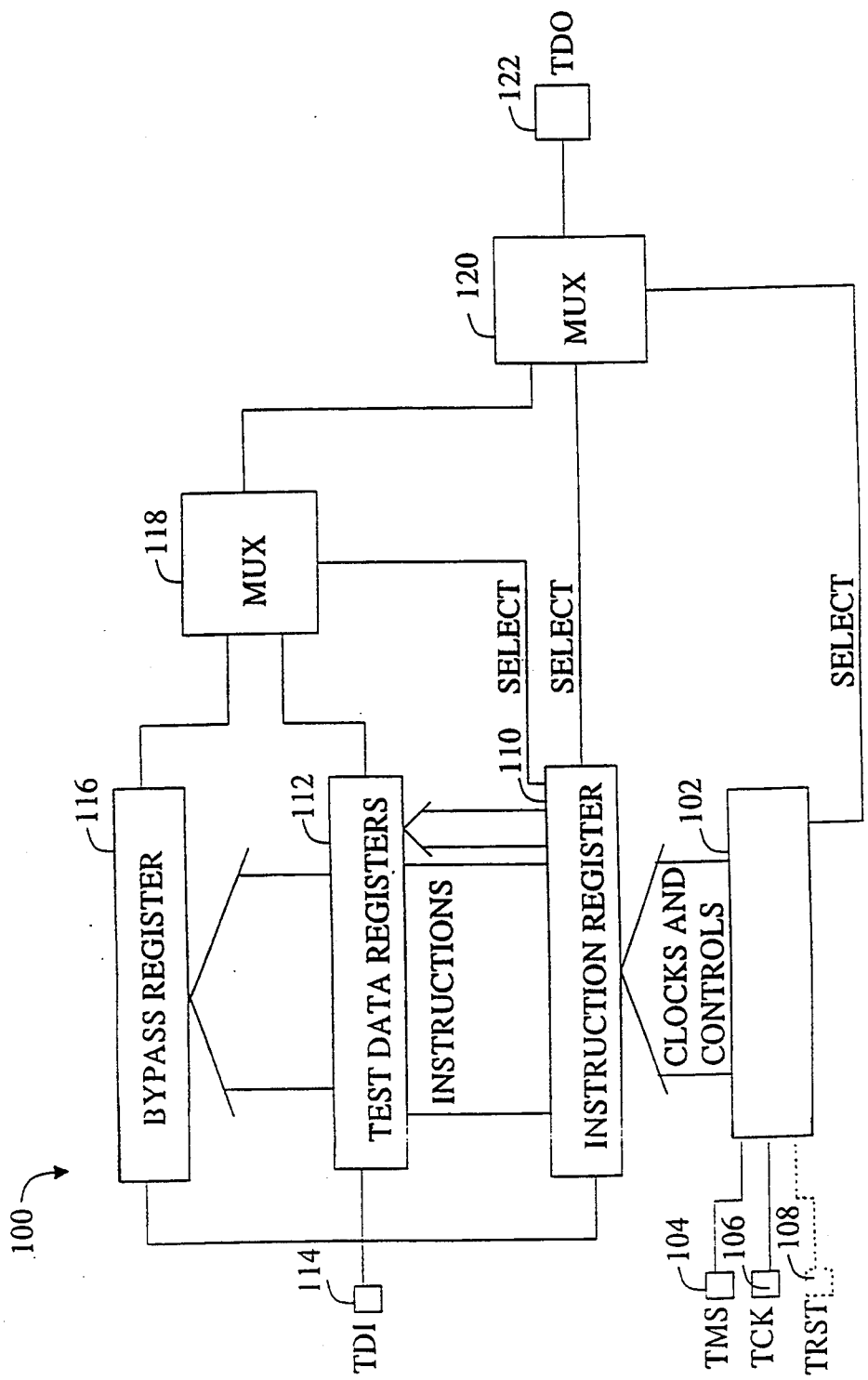
FIG. 1 is a block diagram showing the interconnections of the main functional blocks of the IEEE 1149.1 Test Access Port and Boundary-Scan Architecture.

FIG. 1 depicts in block diagram form the basic structure of the IEEE 1149.1 Test Standard Architecture 100 housed within a single integrated circuit. The details of its operation are described in the IEEE Standard 1149.1 -1990 document, however a brief description of its functional components is helpful in understanding the enhancements to the standard architecture which comprise the present invention.

Implementation of the standard architecture is completely serial in nature. The Test Access Port (TAP) controller 102 receives a control signal or a Test Mode Select input (TMS) 104 and a clock signal or Test Clock input (TCK) 106. An optional reset signal or Test Reset input (TRST) 108 may be used in some applications. The TAP controller 102 maps the TMS signal 104 and the TCK signal 106 into a large instruction set and a number of clock signals, each of which are loaded into the instruction register 110.

In operation, the test data is loaded into the test data registers 112 which make up the boundary-scan cells (not shown) of the IC component under test. The boundary-scan technique involves the inclusion of a shift-register stage (contained in the boundary-scan cell) adjacent to each component pin so that signals at component boundaries can be controlled and observed using scan testing principles.

The sequence for loading the data (instructions) from the Test Data Input (TDI) pin 114 is controlled by the instruction register 110. The instructions loaded into the instruction register are decoded to perform two main functions. First, the loaded instruction defines the set of test data registers which may operate while the instruction is current. Second, the loaded instruction defines the serial test data register path that is used to shift data between the TDI pin 114 and the Test Data Output (TDO) pin 122 during data register scanning.

A bypass register 116 is also provided. The bypass register 116 provides a path by which test data can be routed without interference to a subsequent serially connected test integrated circuit. Thus, a serial system can isolate and test individual integrated circuit pin arrangements. The bypass register 116 is selected via the multiplexor (MUX) 118 based upon current instructions in the instruction register 110 and current values of the incoming test data. The test data output TDO 122 of the MUX 118 is connected to the TDI pin of the next integrated circuit in the series (not shown) via MUX 120. The MUX 120 is controlled by the TAP controller 102. It selects either the test data or the instruction data to be shifted out of the integrated circuit.

The architecture 100 may also include a boundary scan-register (not shown). The boundary-scan register allows testing of circuitry external to the integrated circuit (e.g. a board interconnect) and provides for defined conditions to be established at the periphery of the on-chip system logic while it is itself tested. The boundary scan register also permits the signals flowing through the system pins to be sampled and examined without interfering with the operation of the on-chip system logic.

Figure 2:
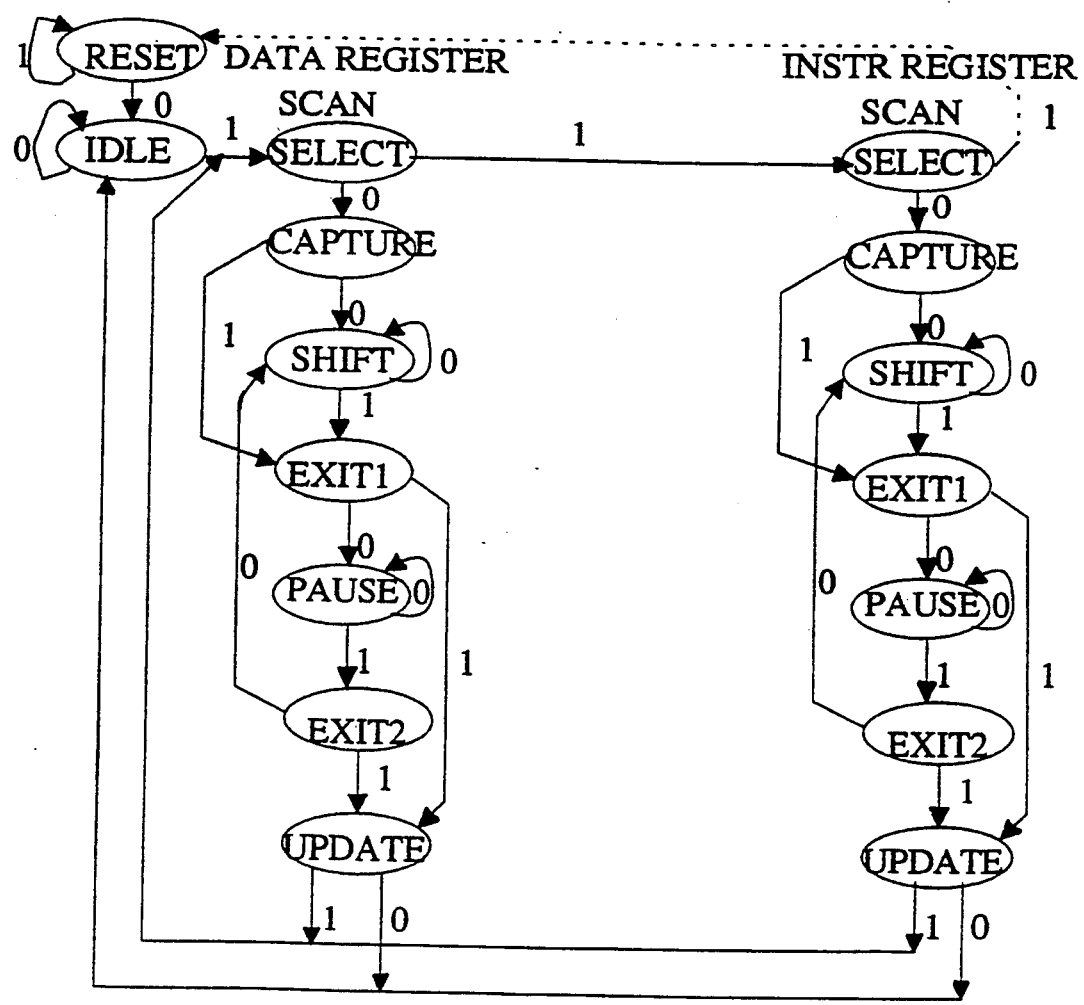
FIG. 2 is a state diagram for the TAP (Test Access Port) controller of the IEEE 1149.1 test standard of FIG. 1.

FIG. 2 shows the state diagram for the TAP controller 102 of FIG. 1. In accordance with the IEEE standard, the value shown next to each state transition represents the digital signal present (1=high; 0=low) at TMS at a time of a rising edge at TCK. All state transitions of the TAP controller occur based on the value of TMS at the time of a rising edge of TCK.

Figure 3:
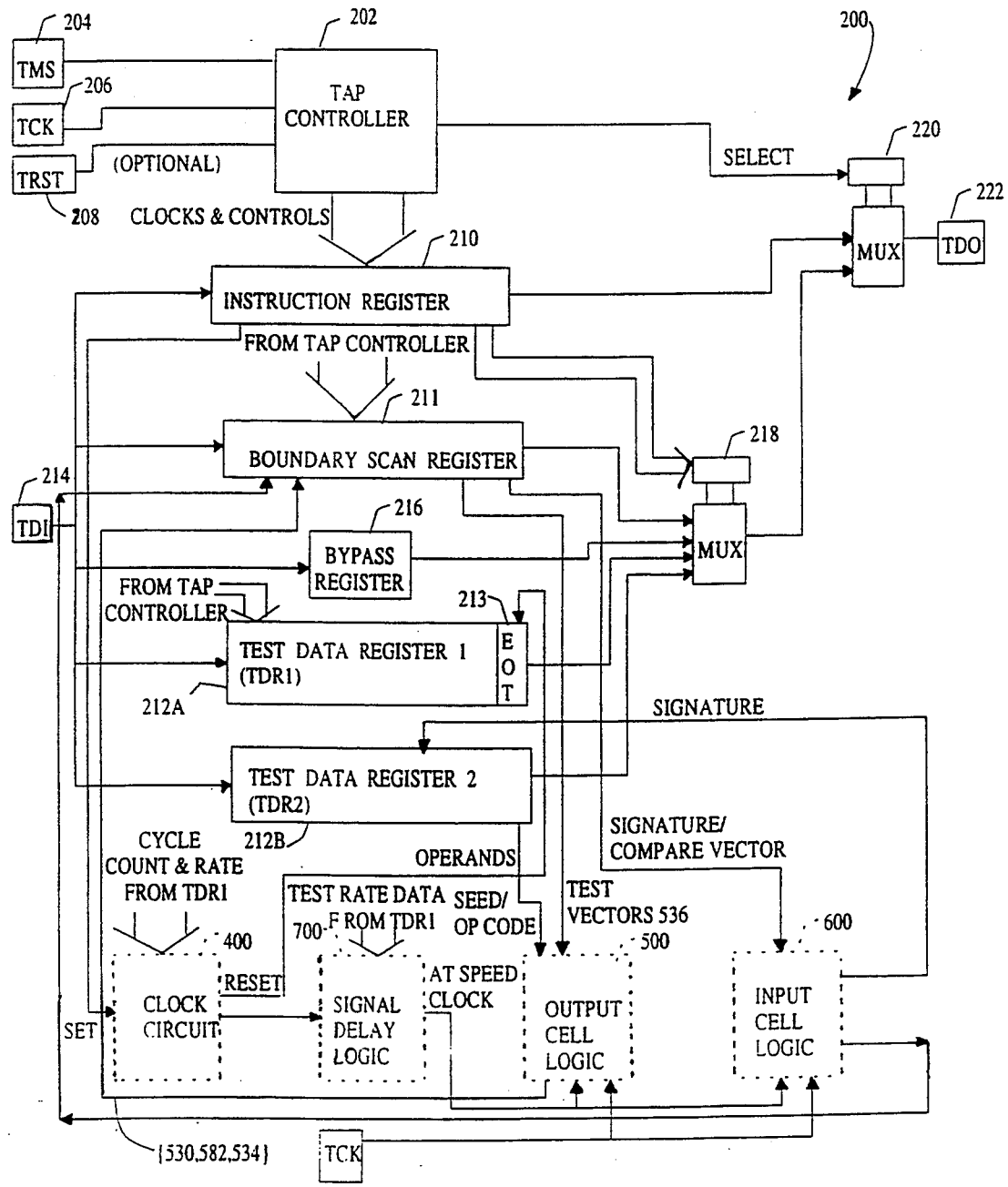
FIG. 3 is a block diagram showing the interconnections of the main functional blocks of the IEEE 1149.1 Test Access Port and Boundary-Scan Architecture of FIG. 1 which has been enhanced with additional logic to permit testing of integrated circuits at speed test.

FIG. 3 depicts in block diagram form the boundary-scan architecture 200 of the present invention which conforms to the IEEE 1149.1 Test Standard Architecture 100 shown in FIG. 1 but which further includes enhancements to permit testing of ICs at speed.

As before with the example prior art standard architecture 100 shown in FIG. 1, the enhanced boundary-scan architecture of the present invention includes a TAP controller 202 having control (TMS) 204 and clock (TCK) 206 signal inputs and optional reset input (TRST) 208. Other common functional block features include the instruction register ("IR") 210, the boundary-scan register ("B-SR") 211, bypass register ("B 216, a group of test data registers including test data register (TDR1") 212a and test data register ("TDR2") 212b and the two serial connected MUX's 218 and 220.

The enhanced architecture 200 further includes additional functional features not present in the IEEE 1149.1 test standard architecture. These enhancements along with additional private instructions (explained more fully below) permit testing of IC components at speed. The enhancements include a clock circuit 400, signal delay logic 700, output cell logic 500 and input cell logic 600. The clock circuit generates the test rates for the specific device under test (DUT). It is responsive to signal input from the IR 210 and the TDR1 212a. The signal delay logic 700 is used to delay applying selected signals within the enhanced test architecture. It is responsive to output from the clock circuit 400 and the TDR1 212a. The output cell logic 500 and input cell logic 600 contain additional logical components which permit functional testing at speed. The output cell logic is responsive to signals from TCK 206, the boundary-scan register 211, test data register 2 (212b) and output from the signal delay logic 700. The input cell logic 600 is responsive to signals from TCK 206, the boundary-scan register 211, and output from the signal delay logic 700.

Figure 4:
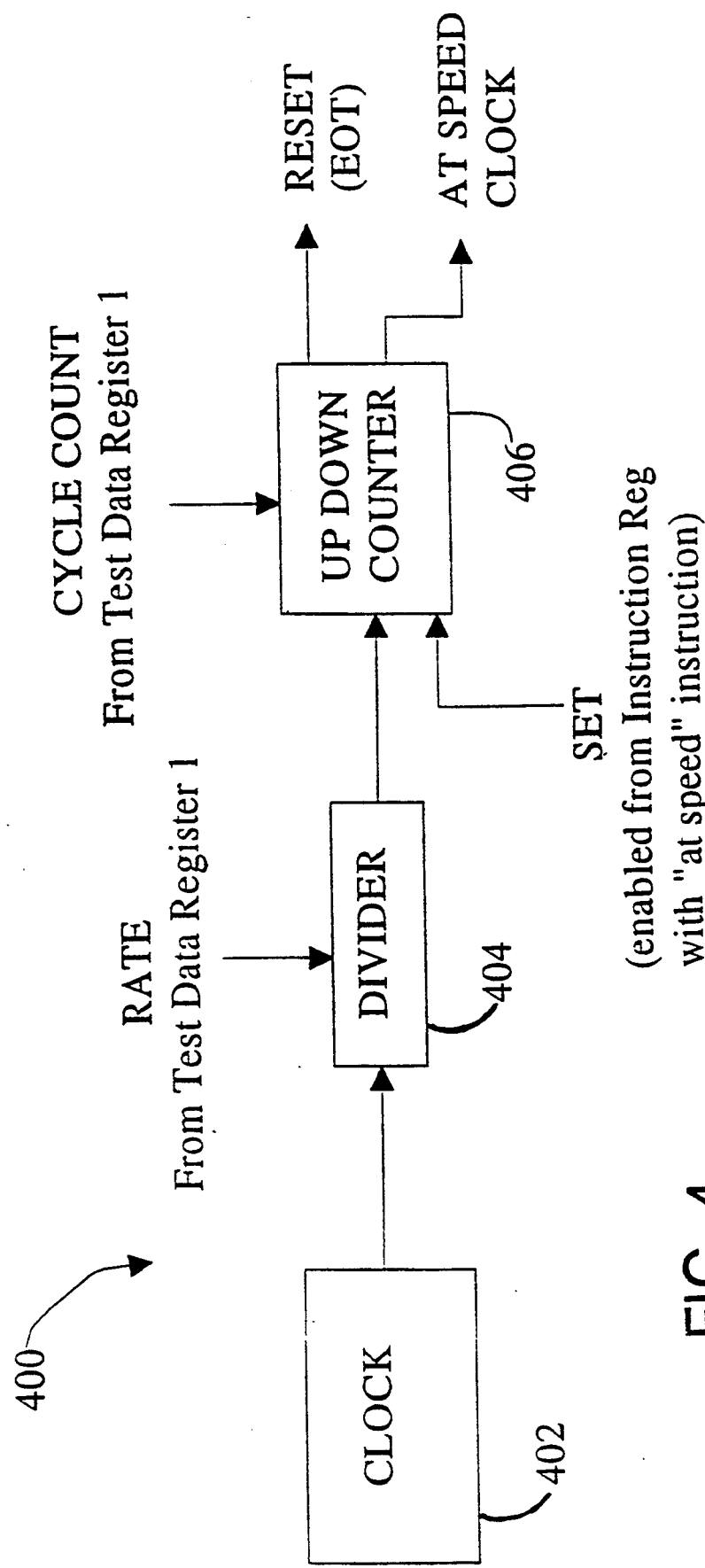
FIG. 4 is an enlarged block diagram showing the main functional blocks of the clock circuit indicated generally as region 400 of FIG. 3.

FIG. 4 shows in greater detail the additional logic of the clock circuit 400 of FIG. 3 which achieves at speed test. The clock circuit 400 comprises a separate internal clock 402, a divider 404 and an up/down counter 406. The internal clock 402 generates the test rates for the desired device under test (DUT). The divider 404 divides the signal frequency received from the internal clock 402 according to the test rate data from the TDR1 212a (FIG. 3). This information is then loaded into the up/down counter 406 which also receives cycle count information from the TDR1 212b.

Test rates of 300 MHz and above can be achieved with the architecture of the present invention. Whereas the present IEEE 1149.1 test standard cannot be used for at speed tests, since its maximum testing speed is limited by the Test Clock input (TCK) signal (typically about 20 MHz) and the length of the boundary scan register. For example, the maximum achievable speed is less than the Test Clock input signal frequency (TCK) divided by the number of inputs and outputs (IOs) of the device under test (Max speed<[TCK/(# of IO)]. If TCK=25 MHz and the number of IOs is 100, the maximum test speed will be less than 25/100 or 250 KHz. With the new architecture the maximum speed with which tests can be done is the maximum rate at which the internal clock 402 operates. With E.C.L. logic this can easily go up to 300 mhz.

Figure 5:
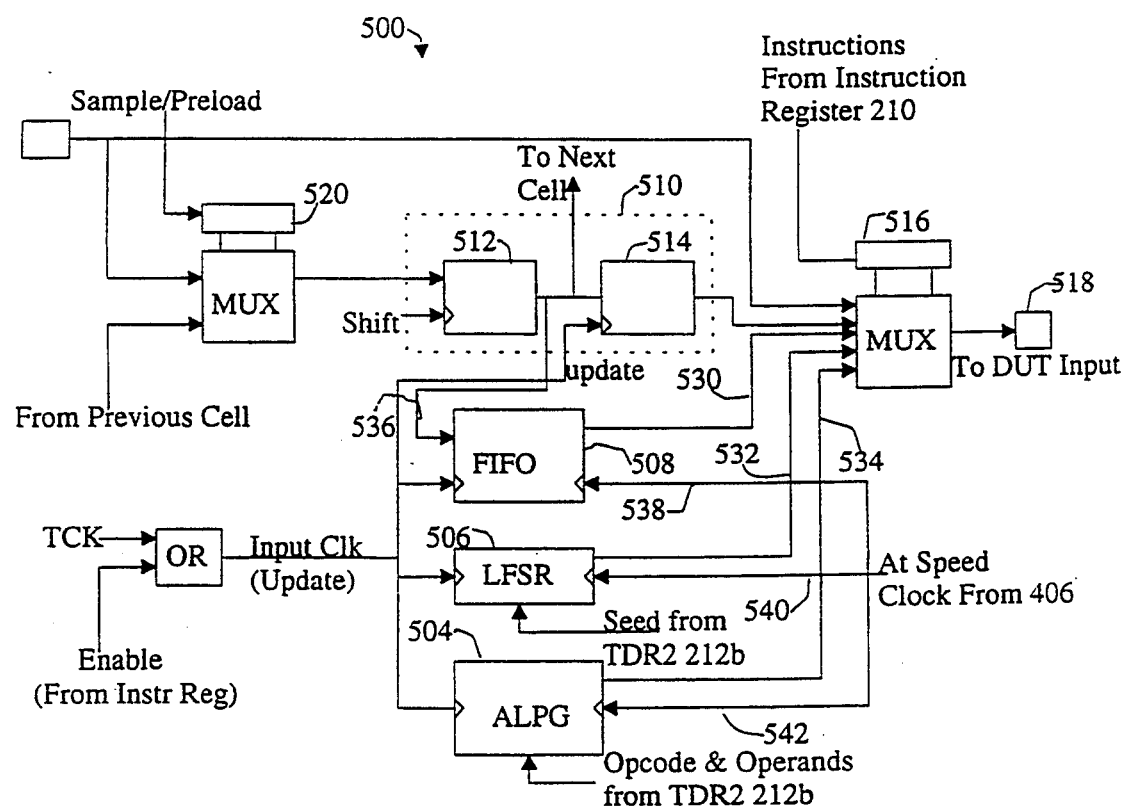
FIG. 5 is an enlarged block diagram showing the main functional blocks of the boundary scan output cell with additional logic indicated generally as region 500 of FIG. 3.
Figure 6:
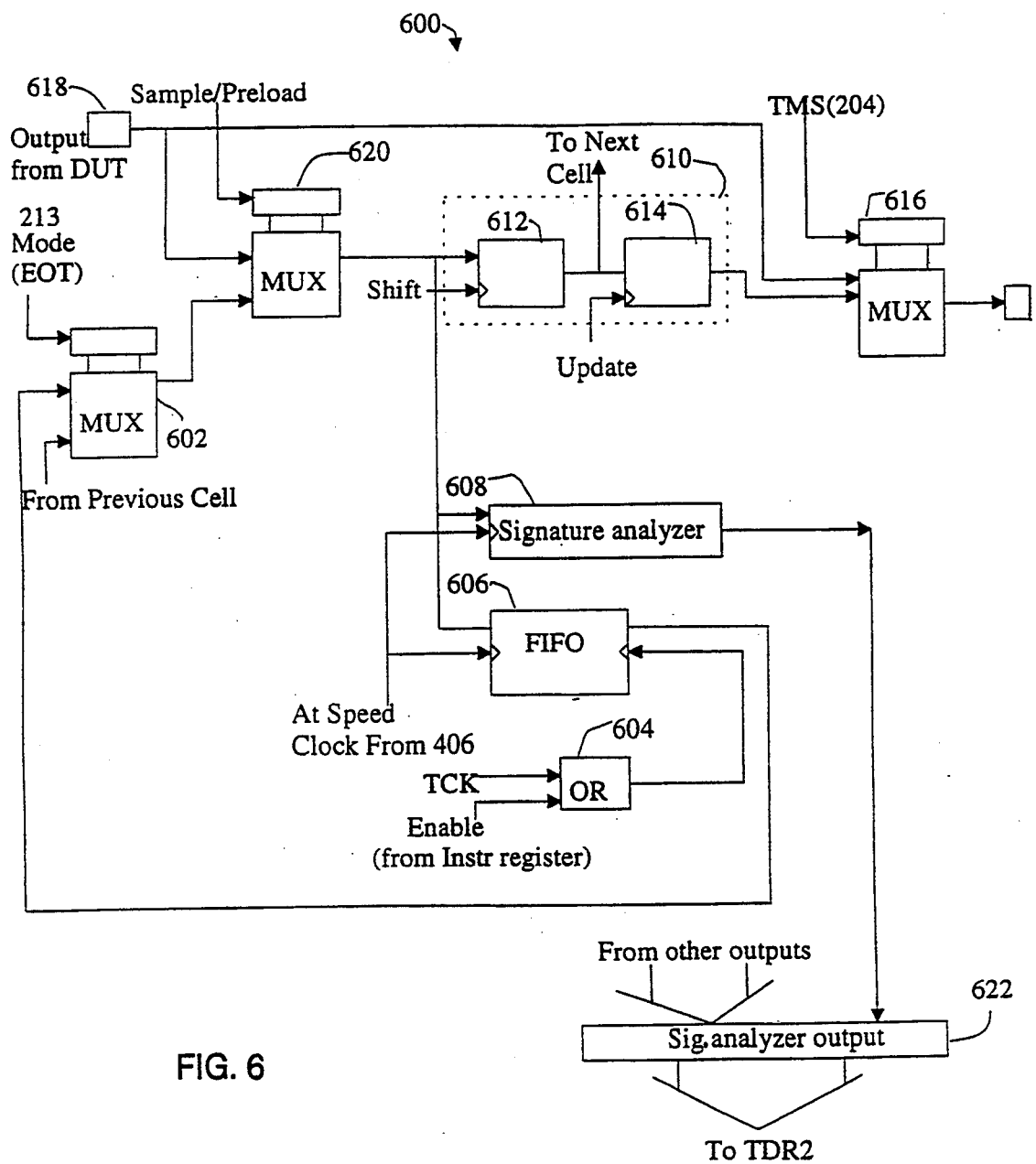
FIG. 6 is an enlarged block diagram showing the main functional blocks of the boundary scan input cell with additional logic indicated generally as region 600 of FIG. 3.

FIGS. 5 and 6 show the additional logic required at the output and input boundary-scan cells, respectively, in order to do at speed test. The additional logic 500 for the output boundary-scan cell of FIG. 5 includes the FIFO (First In First Out) 508, the LSFR (Linear Feedback Shift Register) 506 and the ALPG (Algorithmic Program Generator). Data input from the boundary-scan register 211 to the FIFO 508 is communicated via line 536. A logical OR gate 502 enables a clock signal derived from TMS 204 via the enable signal. The enable signal is turned on before loading the test data into the three devices. It is turned off when the at speed clock output signal from up/down counter 406 operates for input to these three devices via lines 538, 540 and 542. Output from these three devices are mutilplexed via MUX 516 along with output from the flip-flip 510 for connection to the DUT input 518 via lines 530, 532 and 534.

The additional logic 600 for the input boundary-scan cell of FIG. 6 includes OR gate 604, FIFO 606, signature analyzer 608, output from DUT 618, MUX 620. The OR gate 604 has a clock derived from TMS 204 and an enable signal. The FIFO is used to collect the response from the DUT, alternately the response can be compressed into a signature via the signature analyzer 608.

The additional logic described above permit three types of tests which can be done at speed, these three tests include:

1) Functional Tests from stimulus and response data generated by simulators, automatic test pattern generators or manually by designers;
2) Tests from the random patterns generated by the LFSR (linear feedback shift register) 506 of the output cell logic 500 (this form of test is commonly used in built in self test (BIST) techniques); and
3) Tests from patterns generated algorithmically from the ALPG (Algorithmic Program Generator) 504 of the output cell logic 500.

The IEEE 1149.1 test standard specifies certain public instructions which provide the component purchaser access to the test features that facilitate in test tasks. The test standard permits supplementation of the public instructions with private instructions. To perform these three test, the invention utilizes several private instructions. The operation and procedure of these three test are explained with reference to detailed block function diagrams of FIGS. 4–6. The implementation of the private instructions are best understood with reference to the TAP controller state diagram of FIG. 8.

The following three tests may be run on a 386 or 486 PC or a workstation and a low level assembler is the preferred program language.

TEST 1: FUNCTIONAL TEST AT SPEED

Figure 8:
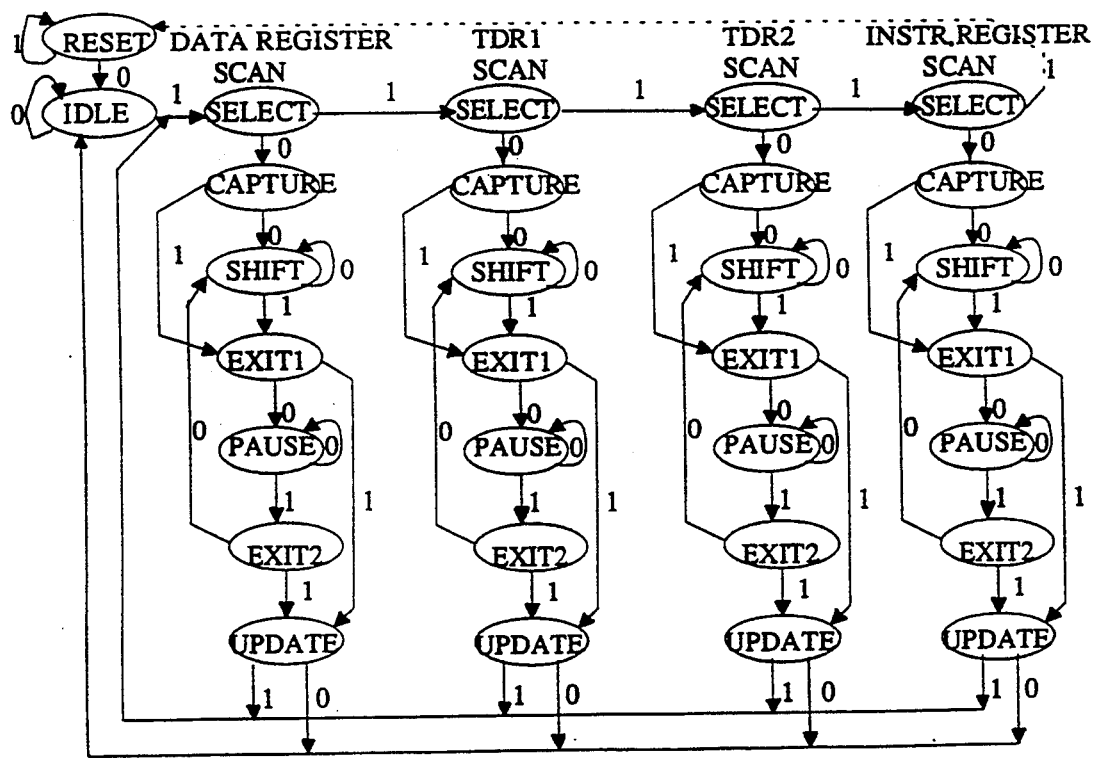
FIG. 8 is a state diagram for the TAP (Test Access Port) controller of the enhanced IEEE 1149.1 test standard of FIG. 3.

To perform a functional test of an integrated circuit at speed the following steps are taken:
 a) The boundary-scan register 211 is connected to the TDI 214 via the standard "INTEST" instruction.
 b) Referring to the state diagram of FIG. 8, first column (Boundary-Scan Register), the first test vector is shifted into the boundary-scan cells via the SHIFT signal.
 c) Data from the boundary-scan cells is then loaded into the FIFOs 508 and 606 behind each IO, via the UPDATE signal.
 d) Steps b) and c) are repeated until all the test vectors are loaded into the FIFOs 508 and 606. FIFO 508 of the output cell logic 500 (FIG. 5) now contains the stimulus data, while the FIFO 606 of the input cell logic 600 (FIG. 6) contain the response data.
 e) A private "LOAD RATE CYCLES" instruction is then loaded into the IR 210 (FIG. 3) as per the state diagram of FIG. 8. This instruction connects the TDR1 212a to TDI 214 to permit loading of the rate and cycle count data from TDI 214 to the TDR1 212a. In the state flow diagram of FIG. 8, this would traverse the TEST DATA REGISTER 1-SCAN path.
 f) A private "BEGIN TEST" instruction is then loaded into the IR 210. This instruction first configures the divider 404 by downloading test rate data from TDR1 212a into the divider 404 and then loads the number of test cycles from the TDR 1 212a into the up/down counter 406 of the clock circuit 400.
 g) A private "AT SPEED" instruction is then loaded into the IR 210 as per the state diagram of FIG. 8. This instruction does the following:
  i) disables the clock "enable" at the input of OR gates 502 and 604 in FIGS. 5 and 6, respectively.
  ii) connects the output of the FIFO 508 of the output logic cell 500 to the DUT inputs pads 518 (FIG. 5);
  iii) connects the DUT outputs 618 of the input logic cell 600 to the FIFO 606 (FIG. 6);
  iv) connects the TDR 1 212a to TDO 222 (FIG. 3);
  v) enables the clock signal of the up/down counter (FIG. 4). This signal is the OUTPUT clock signal to the FIFO 508 of the output cell logic 500 (FIG. 5) and the INPUT clock signal to the FIFO 606 of the input cell logic 600 (FIG. 6).

The result of the "AT SPEED" instruction is that stimuli is applied to the DUT at speed and its response is collected in the FIFO 606. Alternatively, the response can be compared with the response data in FIFO 606.

h) The end of test occurs when the up/down counter 406 of the clock circuit 400 reaches the cycle count. The up/down counter 406 is then reset and an end of test (EOT) signal is sent to the TDR 1 212a. This, in turn:
  i) sets the EOT bit 213 in the TDR 1 212a;
  ii) parallel loads the data from the signature analyzer output 622 (FIG. 6) into the TDR2 212b;
  iii) connects the output from the FIFO 606 to the boundary-scan cell 610 (FIG. 6).
 i) The EOT bit 213 is polled via TDO 222 by the host computer.
 j) After polling the EOT bit 213 the host can either connect the boundary-scan register 211 to TDO 222 via the "INTEST" instruction or leave the TDR 1 212a connected to TDO. In the former case, i.e., where the boundary-scan register 211 is connected to TDO 222, response data from the FIFO 606 from the input cell logic 600 can be shifted to the host via the SHIFT signal for analysis. In the latter case the signature data from the TDR1 212b can be shifted to the host via TDO 222. The signature data can be used for a quick pass/fail from judgment for production tests.

TEST 2: TESTS FROM RANDOM PATTERNS

For this test the following steps are performed:
 a) The above described private "LOAD RATE CYCLES" instruction is loaded into the instruction register 210 via TDI 214 as per the state diagram, column 4 IR-SCAN in FIG. 8. This connects the TDR 1 212a to TDI 214. The test rate and cycle count are then loaded into the TDR1 212a via TDI 214.
 b) A private "LOAD SEED" instruction is then loaded into the IR 210. This connects the TDR2 212b to TDI 214. The initializing data or "seed" is then loaded into the TDR2 212b via TDI 214. This occurs at the UPDATE state in the third column (TDR2-SCAN) of the state diagram of FIG. 8.

c) The "BEGIN TEST" instruction is then loaded into the IR 210. This instruction performs three functions:
  i) first, it configures the divider 404 of the clock circuit 400 to the test rate in the TDR1 212a;
  ii) second, it loads the number of test cycles from the TDR1 212a into the up/down counter 406; and
  iii) third, it loads the seed from the TDR2 212b into the LFSR 506 of the output cell logic 500 (FIG. 5).

d) A private "LFSR" instruction is then loaded. This instruction loads the seed from the TDR2 212b in the LFSR 506 and connects the output of the LFSR 506 to the DUT input 518 via MUX 516. Also, the input clock to the LFSR is enabled at 502.

e) A private "RUNBIST" instruction is then loaded into the IR 210. This instruction performs the following functions:
  i) connects the output of LFSR 506 to the DUT input 518;
  ii) connects the DUT output at 618 to the signature analyzer 608 and FIFO 606 of the input cell logic 600 (FIG. 6);
  iii) connects the TDR1 212a to TDO 222;
  iv) enables the at speed clock signal of the FIFO 606 of the input cell logic 600 (FIG. 6);
  v) disables the "enable" clock at the OR gates 502 and 604 in FIGS. 5 and 6, respectively.

The result of step e) is that random patterns generated by the LFSR 506 are applied to the DUT inputs at speed and the response from the DUT is collected in the FIFO 606 of the input cell logic 600 and the signature analyzer 608 (FIG. 6). Alternatively, the response data can be compared with the response data in FIFO 606.

f) At the end of the test, when the up/down counter 406 reaches the cycle count, it resets the counter and sends out an end of test (EOT) signal. This EOT does the following:
  i) sets the EOT bit 213 in the TDR1 212a;
  ii) parallel loads the data from the signature register 622 into the TDR 1 212a;
  iii) connects the output from the FIFO 606 of the input cell logic 600 to the boundary-scan cell 610 via MUX 602 and Mux 620;

f) The EOT bit 213 is polled via TDO 222 by the host.

g) After polling the EOT bit 213 the host can either connect the boundary-scan register 211 to TDO 222 via the INTEST instruction or leave the TDR1 212a connected to TDO 222. In the former case, response data from the FIFO 606 can be shifted to the host via TDO 222 using the "SHIFT" signal for analysis. In the latter case, the signature data from the test data register one 212a can be shifted to the host via TDO 222. This signature can be used to make a quick pass/fail judgment for production tests.

TEST 3: TESTS FROM PATTERNS GENERATED ALGORITHMICALLY FROM ALPG

This test is done in a similar fashion to TEST 2 described above. However, rather than loading a seed, the op code and operands are loaded into the TDR2 212b with the "LOAD OPERAND & OPCODES" instruction. Instead of "RUNBIST" the "ALPG" instruction is loaded in the IR 210. This connects the output of the ALPG 504 to the DUT input 518 and activates the ALPG 504 by enabling the output clock (i.e., the at speed clock of the output boundary-scan cell) at 504.

The microcode for each of the above described private instructions for which the invention may be preferably enabled are listed below:

1. "LOAD RATE CYCLES"

This instruction connects the Test Data Register 1, in FIG. 3, to TDI, Loads the "RATE" and the "CYCLE COUNT" via TDI into the Test Data Register 1. In the state flow diagram in FIG. 8, this would traverse the TEST DATA REGISTER 1-SCAN path. In the microcode below, comments are expressed as→/* this is a comment */. The microcode for this instruction is as follows:

1. RESET;
2. TCK, TMS=0;
3. TCK, TMS=1;
4. TCK; TMS=1;
5. TCK, TMS-0;
6. TCK; TMS=0;
7. TDI=rate;

---

8. REPEAT{
     TCK; /*shift rate data into TDR1*/
   }
   until rate is shifted into TDR1*/
9. TDI=cycle count;
   repeat{
     TCK; /*shift cycle count data into TDR1*/
   }
   until cycle count is shifted into TDR 1;

---

10. TCK, TMS=1;
11. TCK, TMS=0; /*pause TDR 1*/
12. PAUSE TDR 1;

2. "BEGIN TEST"
This instruction,
a) Configures the divider in FIG. 4, to the test rate data in the test data register 1 and,
b) Sets the UP-DOWN counter to the cycle count data in the test data register 1. This is done by downloading the test rate data and cycle count data simultaneously from TDR 1 into the divider during the "UPDATE" TDR 1 stage in the state flow diagram in FIG. 8.

The microcode for doing this is as follows:
1. PAUSE TDR 1;
2. TCK, TMS=1;
3. TCK, TMS=1; /*update*/
4. TCK, TMS=0; /*idle*/
5. IDLE;

3. "AT SPEED"
This instruction,
a) Connects the output of the FIFO in FIG. 5 to the DUT input pads.
b) Connects the DUT outputs to the FIFO in FIG. 6.
c) Connects the Test Data Register 1 in FIG. 3 to TDO.
d) Disables the Input clock signal of the OR gate to the FIFO in FIG. 5 and FIG. 6.
e) Starts the "at speed" clock to the FIFOs in FIG. 5 and FIG. 6.

This is done by shifting the "AT SPEED" instruction into the instruction register, and updating the instruction register at the "UPDATE" state under INSTRUCTION REGISTER-SCAN in the state flow diagram in FIG. 8. The microcode to do this is as follows:

1. IDLE;
2. TCK, TMS=1;
3. TCK, TMS=1;
4. TCK, TMS=1;
5. TCK, TMS=1;
6. TCK, TMS=0;
7. TCK, TMS=0;
8. TDI="at speed";
9. repeat{TCK; /*shift code for "at speed" into IR*/} until "at speed" is shifted into IR.
10. TCK, TMS=1;
11. TCK, TMS=0;
12. TCK, TMS=1;
13. TCK, TMS=1; /*update*/
14. TCK, TMS=0; /*idle*/
15. IDLE;

4. "LOAD SEED"

This instruction connects the Test Data Register 2 (TDR 2) in FIG. 4 to TDI and loads the "seed" for the "RUNBIST" instruction into TDR 2. With reference to the state flow diagram in FIG. 8, the seed is shifted into TDR 2 during the "SHIFT" state under the TEST DATA REGISTER 2-SCAN.

The microcode to achieve this is as follows;
1. IDLE;
2. TCK, TMS=1;
3. TCK, TMS=1;
4. TCK, TMS=1;
5. TDI="seed";
6. repeat{TCK; /*shift "seed" into TDR 2*/ } until "seed" is shifted into TDR 2;
7. TCK, TMS=1;
8. TCK, TMS=0; /*pause TDR 2*/
9. PAUSE TDR 2;

5. "LOAD OPERAND & OP CODES".

This instruction connects the Test Data Register 2 (TDR 2) in FIG. 4 to TDI and loads the "operand" and "op codes" for the "ALPG" instruction into TDR 2. With reference to the state flow diagram in FIG. 8, the "operand" and "op codes" are shifted into TDR 2 during the "SHIFT" state under the TEST DATA REGISTER 2-SCAN. The microcode to achieve this is as follows:
1. IDLE;
2. TCK, TMS=1;
3. TCK, TMS=1;
4. TCK, TMS=1;
5. TDI="operand";
6. repeat{TCK; /*shift "operand" into TDR 2*/ } until "operand" is shifted into TDR 2;
7. TDI="op codes";
8. repeat{TCK; /*shift "op codes" into TDR 2*/ } until "op codes" are shifted into TDR 2;
9. TCK, TMS=1;
10. TCK,TMS=0; /*pause TDR 2*/
11. PAUSE TDR 2;

6. "LFSR"

This instruction,
a) Downloads the "seed" (or "opcode and operands") from TDR 2 into the LFSR (or ALPG) in FIG. 5. The "seed" (or "opcode & operands") is downloaded at the UPDATE state under TEST DATA REGISTER 2-SCAN in FIG. 8. The microcode to do this is as follows:
1. PAUSE TDR 2;
2. TCK, TMS=1;
3. TCK, TMS=1; /*update*/
4. TCK, TMS=0; /*idle*/
5. IDLE;

7. "RUNBIST".

This instruction,
a) Connects the output of the LFSR in FIG. 5 to the DUT input.
b) Connects the DUT output in FIG. 6 to the signature analyzer.
c) Connects TDR 1 to TDO in FIG. 3.
d) Enables the "at speed" clock to the FIFO in FIG. 6.
e) Disables the enable clock signal at the OR gates in FIG. 5 and FIG. 6.
f) Starts the "at speed" clock to the FIFOs in FIG. 5 and FIG. 6. This is done by shifting the "RUNBIST" instruction into the instruction register, and updating the instruction register at the "UPDATE" state under INSTRUCTION REGISTER-SCAN in the state flow diagram in FIG. 8. The microcode to do this is as follows:
1. IDLE;
2. TCK, TMS=1;
3. TCK, TMS=1;
4. TCK, TMS=1;
5. TCK, TMS=1;
6. TCK, TMS=0;
7. TCK, TMS=0;
8. TDI="runbist";
9. repeat {TCK; /*shift code for "runbist" into IR*/} until "runbist" is shifted into IR.
10. TCK, TMS=1;
11. TCK, TMS=0;
12. TCK, TMS=1;
13. TCK, TMS=1; /*update*/
14. TCK, TMS=0; /*idle*/
15. IDLE;

8. "ALPG".

This instruction,
a) Connects the output of the ALPG in FIG. 5 to the DUT input.
b) Connects the DUT output in FIG. 6 to the signature analyzer.
c) Connects TDR 1 to TDO in FIG. 3.
d) Enables the "at speed" clock to the FIFO in FIG. 6.
e) Disables the enable clock signal at the OR gates in FIG. 5 and FIG. 6.
f) Starts the "at speed" clock to the FIFOs in FIG. 5 and FIG. 6.

This is done by shifting the "ALPG" instruction into the instruction register, and updating the instruction register at the "UPDATE" state under INSTRUCTION REGISTER-SCAN in the state flow diagram in FIG. 8. The microcode to do this is as follows:
1. IDLE;
2. TCK, TMS=1;
3. TCK, TMS=1;
4. TCK, TMS=1;
5. TCK, TMS=1;
6. TCK, TMS=0;
7. TCK, TMS=0;
8. TDI="alpg";
9. repeat {TCK; /*shift code for "alpg" into IR*/} until "alpg" is shifted into IR.
10. TCK, TMS=1;
11. TCK, TMS=0;
12. TCK, TMS=1;
13. TCK, TMS=1; /*update*/
14. TCK, TMS=0; /*idle*/

15. IDLE.

OFFSETS FOR INPUT SIGNALS AND OUTPUTS

Figure 7:
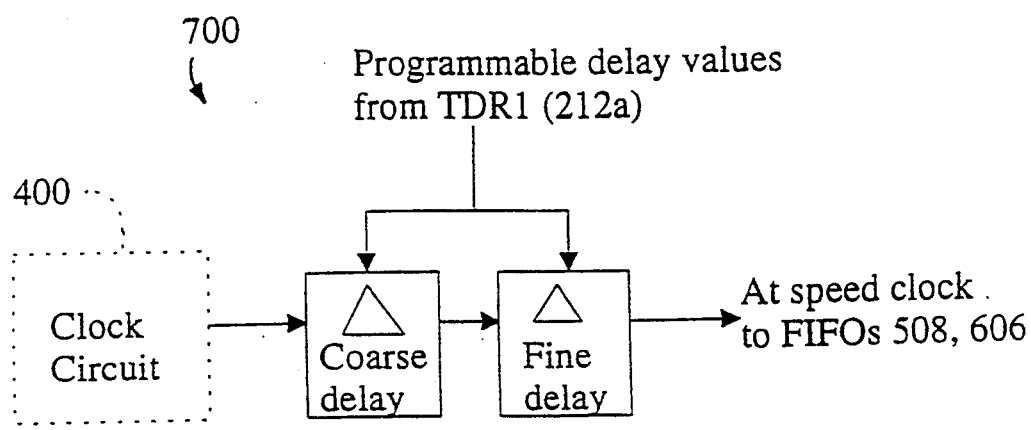
FIG. 7 is an enlarged block diagram showing the main functional blocks of the signal delay logic indicated generally as region 700 of FIG. 3.

Sometimes it may be necessary to delay applying certain signals or delay measurement of some signals. The signal delay logic 700 permits signals to be applied to the DUT at different times and permits response signals to be sensed at different times. FIG. 7 shows one embodiment for signal delay logic 700 which achieves this purpose. The signal delay logic 700 includes a first course delay unit 702 and a second fine delay unit 703. The course delay unit is responsive to the at speed clock signal generated by the clock circuit 400 and delays the signals by big blocks of time intervals. The fine delay unit 703 is responsive to the coarse delay unit 702 and further delays the signals by smaller blocks of time intervals. The output of the fine delay unit 703 is sent to the at speed clock of FIFOs 508 and 606 of the output cell logic 500 and the input cell logic 600, respectively.

Figure 7A:
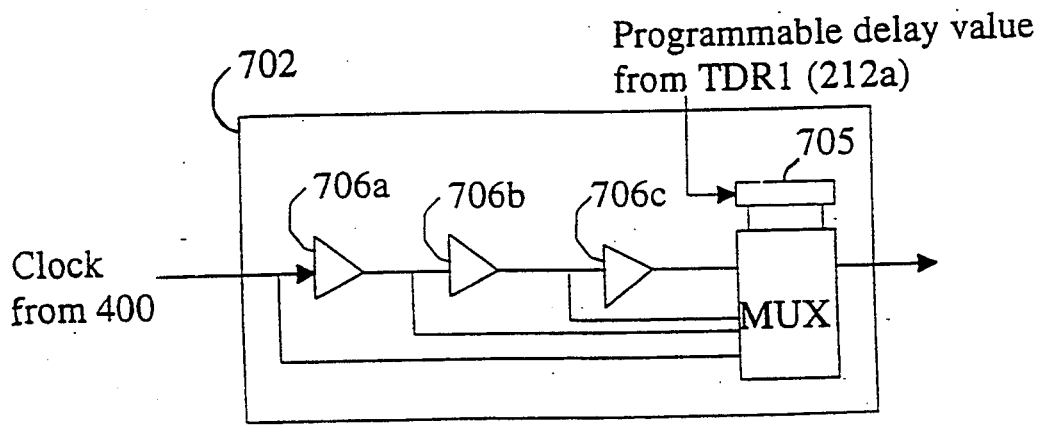
FIG. 7A is an enlarged block diagram showing the detail of the main functional blocks of the programmable delay unit indicated generally as region 7A—7A of FIG. 7.

FIG. 7A shows the detail of a representative implementation for a programmable coarse delay unit 702. The programmable delay unit includes a series of unit delay elements 706a-c wherein each output of the unit delay elements 706a-c are multiplexed by MUX 705. The MUX 705 also receives AC parametrics data from a test data register (as indicated by the arrow). This data is generated per a desired program in order to delay the output from MUX 705 by 0, 1, 2 or 3 units according to which output, if any, of the unit delays 706a-c is selected. Similarly, the fine delay 703 may include a like programmable delay arrangement to delay the signal by several finer units. This delayed signal goes to the at speed clocks of FIFOs 508 and 606, (i.e., to the output clock of FIFO 508 and to the input clock of FIFO 606).

Figure 9:
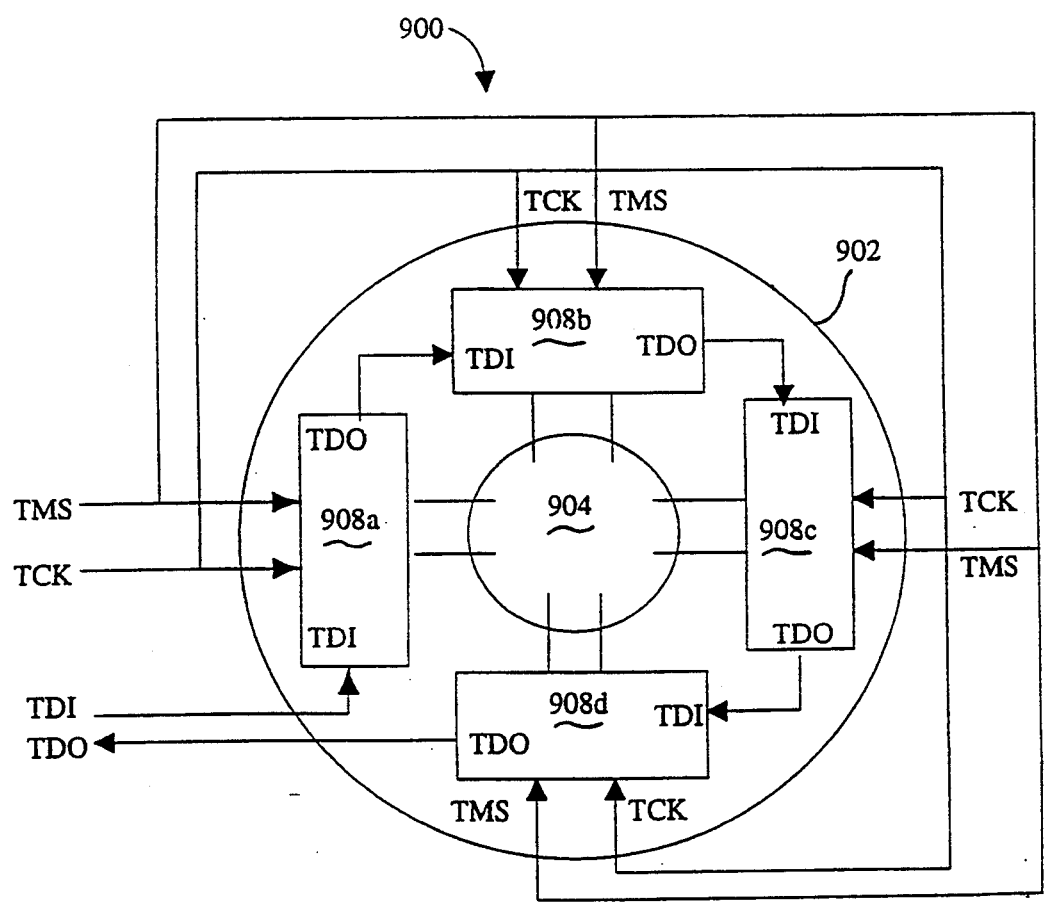
FIG. 9 shows a first implementation of the invention wherein the enhanced boundary scan architecture is configured on a test chip which is mounted on a probe card for at speed wafer or die level testing.
Figure 10:
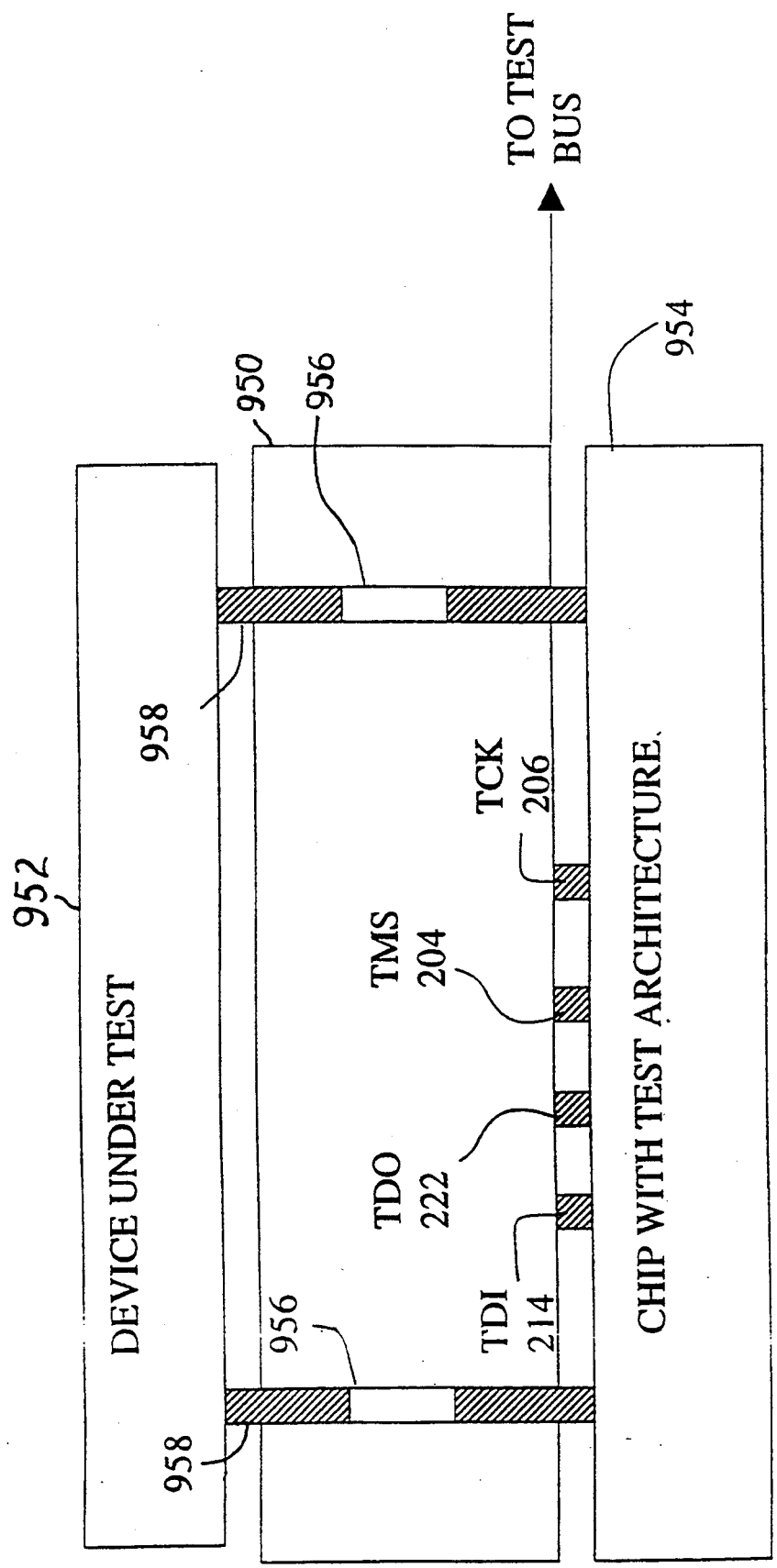
FIG. 10 shows a second implementation of the invention wherein the enhanced boundary scan architecture is configured on a test chip which plugs into a double sided socket adapter for at speed package level testing.
Figure 11:
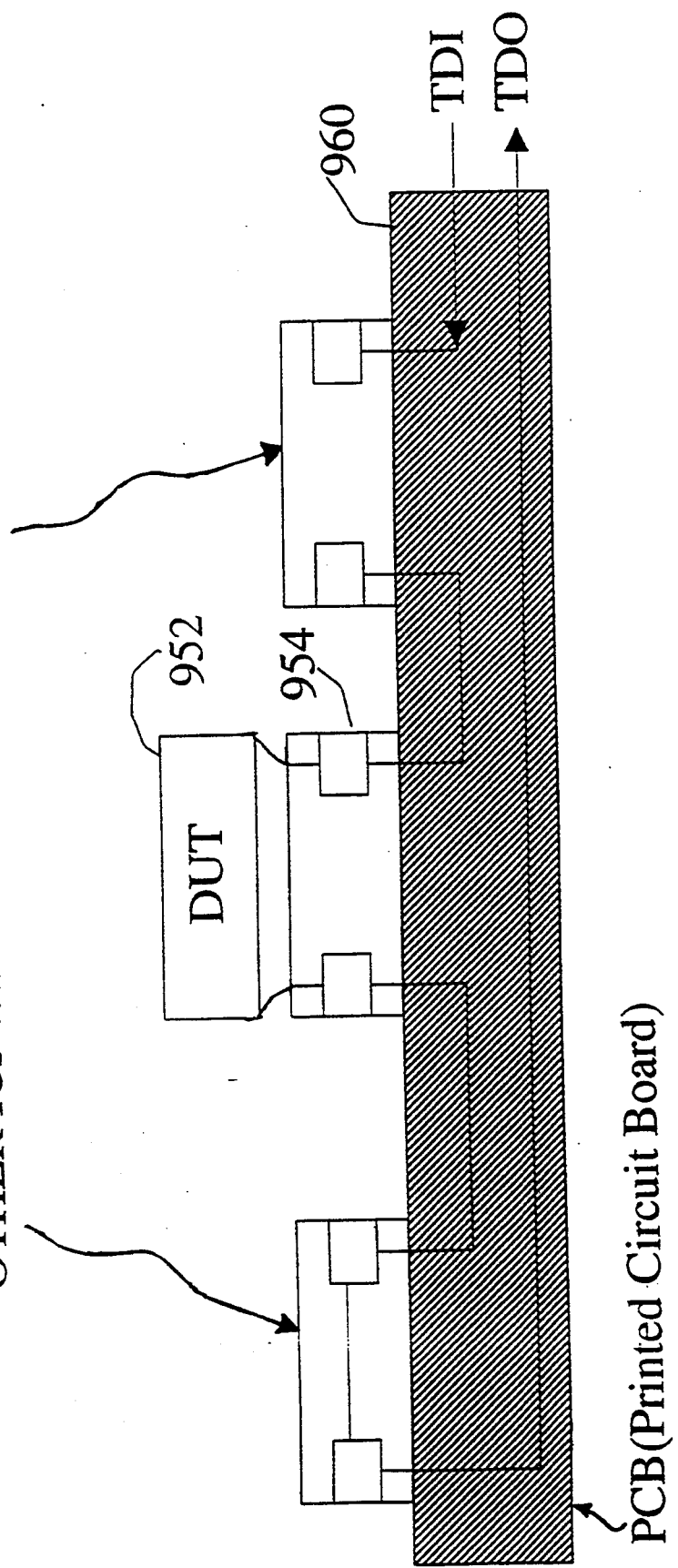
FIG. 11 shows a third implementation of the invention wherein the enhanced boundary scan architecture is configured on a test chip which is sandwiched between a device under test and a printed circuit board for at speed board level testing.

FIGS. 9–11 show preferred implementations of the invention wherein the test architecture is configured on a chip and mounted on a probe card (FIG. 9), placed within a socket or adapter (FIG. 10, or sandwiched in between a device under test (DUT) and a printed circuit board (DCB).

Referring to FIG. 9, a top view of a preferred implementation of the enhanced architecture of the present invention on a probe card 900 is shown. The probe card 900 comprises a printed circuit board 902 having a central aperture 904 for providing access to the IC to be tested (not shown). Provided mounted on the board 902 are symmetrically arranged test circuits 908a-d which are connected in series. The test circuits 908a-d preferably contain the control circuitry and enhanced IEEE standard architecture as described above with reference to FIG. 3-8. The probe card 900 includes the standard connections from the TAP controller (TMS, TCK, TDI and TDO) as shown.

FIG. 10 depicts the arrangement of an adapter/-socket 950, a device under test (DUT) 952, and a chip 954 having the enhanced test architecture of the present invention. The test chip includes the standard connections from the TAP controller (TMS, TCK, TDI and TDO) as shown. The adapter/socket 950 is preferably a double socket adapter having socket holes 956 dimensioned to match the pins 958 of DUT 952. The adapter/-socket 950 in combination with the test chip 954 permit at speed package level testing of DUTs which do not contain standardized test circuitry.

FIG. 11 depicts a third implementation of the enhanced test architecture illustrating at speed test of ICs at the board level wherein the test chip 954 is mounted on a printed circuit board 960 and is sandwiched between the board 960 and a device under test (DUT) 952.

Figure 12:
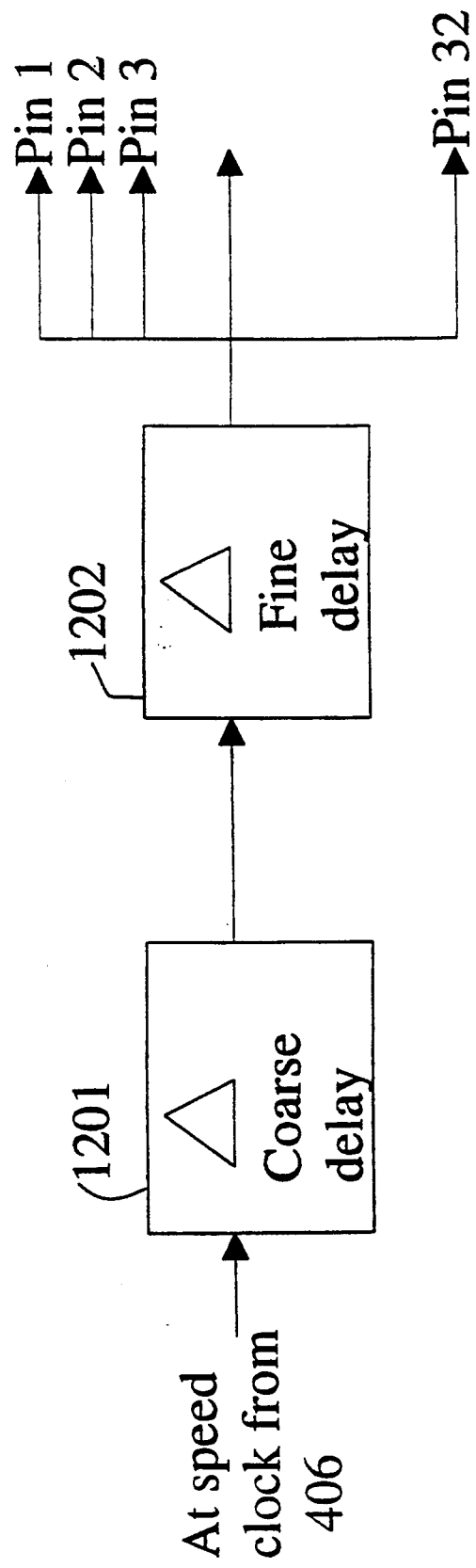
FIG. 12 is an enlarged block diagram showing how one delay unit in FIG. 7 can be used to control 32 pins.

FIG. 12 shows how one delay unit can be used for 32 DUT pins. The coarse delay unit offsets the clock by larger time units than the fine delay unit. The fine delay unit offsets the signal by smaller units of time; it acts as a time vernier.

DC PARAMETRICS

Figure 13:
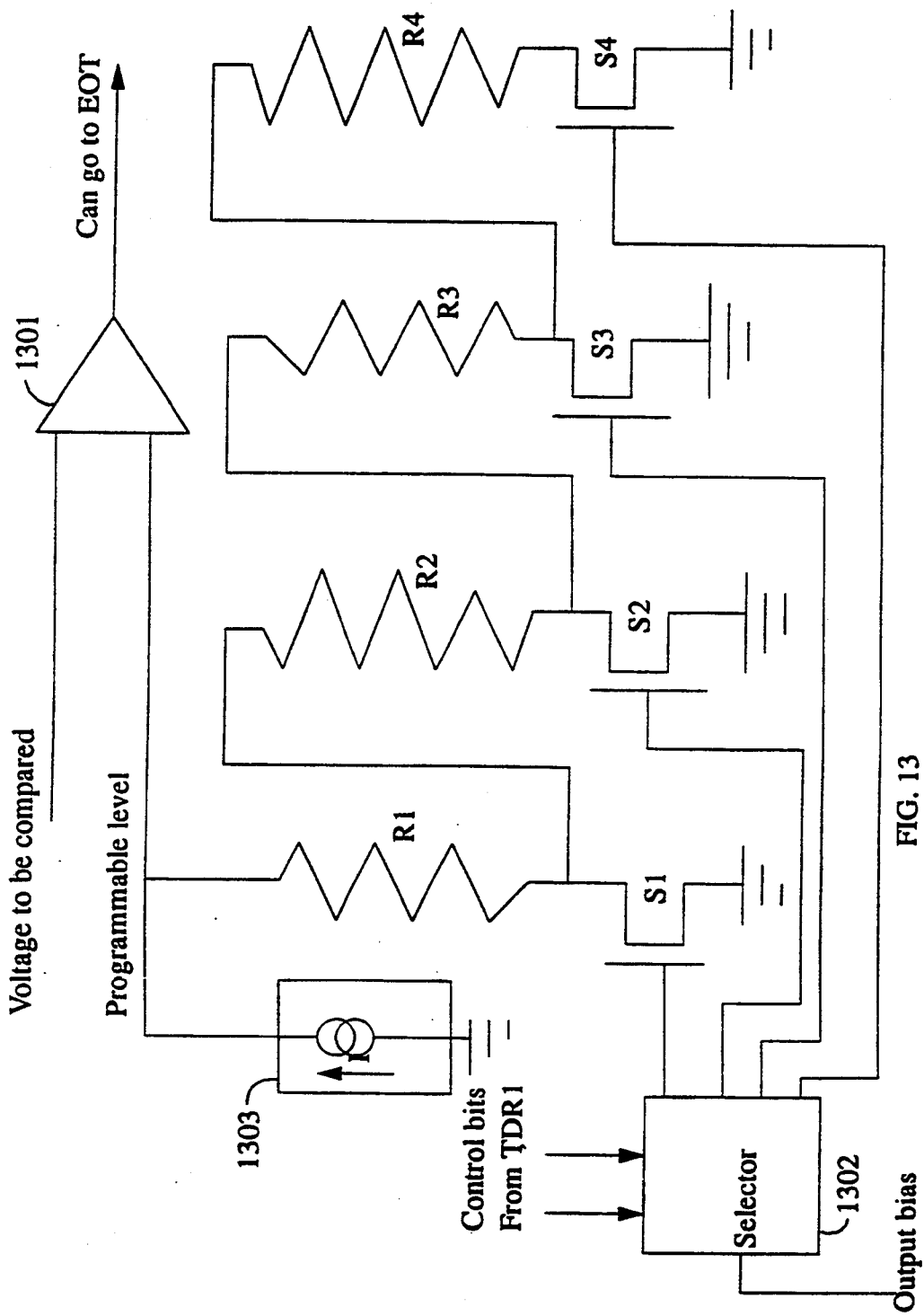
FIG. 13 is an alternate embodiment of a programmable comparator for measuring input and output voltage thresholds.

To measure input and output thresholds, an analog comparator 1301 is used. Variable voltage levels are selected by a 2×4 selector as shown in FIG. 13. The comparator is used to measure voltage at the outputs of the DUT, commonly referred to as VOH and VOL in the trade, for voltage output high and voltage output low.

The VOH and VOL values can be programmed by entering the control bits into a test data register. Depending on the control bits, either switch S1, S2, S3 or S4 is closed. If S4 is closed, then the constant current from 1303 passes through resistors R1, R2, R3 and R4. Thus, the programmed voltage level will be the constant current I×(R1+R2+R3+R4). By programming different control bits, different voltage levels can be programmed.

It should be understood that various modifications within the scope of this invention can be made by one of ordinary skill in the art without departing from the spirit thereof. I therefore wish my invention to be defined by the scope of the appended claims in view of the specification as broadly as the prior art will permit.

What is claimed is:

1. A method for performing a functional test of integrated circuits at speed using a tester apparatus which includes a test bus having control and data signal lines, a test bus controller for transmitting stimulus data to and receiving response data from a device under test (DUT), and a boundary-scan architecture which includes a plurality of registers coupled to the test bus including an instruction register for receiving clock and control signals from the test bus controller and storing the clock and control signals as large instruction sets, a boundary-scan register including a plurality of input and output boundary-scan cells for buffering stimulus and response signals associated with the DUT, a bypass register for providing a signal path by which test data can be routed without interference with a subsequent serially connected DUT, and a test data register for storing test parameters associated with the DUT, said method comprising the steps of:
    a) generating a high frequency clock signal as stimuli is applied to the DUT;
    b) dividing said high frequency clock signal into a desired test rate frequency in response to test rate information received from the test data register; and
    c) determining a number of test cycles for the DUT from divided clock signal information and test cycle count data received from the test data register.

2. A method for performing a functional test of integrated circuits at speed as in claim 1 further comprising the steps of:
    a) selectively delaying stimulus and response data transmitted to and received from the DUT; and
    b) compressing at speed response data collected at each output boundary-scan cell of the boundary-scan register into a signature for comparison with a known good signature for said DUT to verify that said DUT is a good device.

3. A method for performing a functional test of integrated circuits at speed as in claim 2 wherein each of the output boundary-scan cells of the boundary-scan register includes logic means for performing at speed test of the DUT from functional, algorithmic and random test pattern data received from the test data register.

4. A method for performing a functional test of integrated circuits at speed as in claim 3 wherein all steps for at speed testing are in the form of private instructions which supplement the public instructions of the IEEE 1149.1 test standard.

* * * * *